US006690697B1

(12) United States Patent
Kahen

(10) Patent No.: US 6,690,697 B1
(45) Date of Patent: *Feb. 10, 2004

(54) VERTICAL CAVITY LIGHT-PRODUCING DEVICE WITH IMPROVED POWER CONVERSION

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/224,238

(22) Filed: Aug. 20, 2002

(51) Int. Cl.$^7$ .......................... H01S 3/14; H01S 3/091; H01S 3/08
(52) U.S. Cl. .............................. 372/39; 372/70; 372/96
(58) Field of Search ............................... 372/39, 96, 70

(56) References Cited

U.S. PATENT DOCUMENTS

| | | |
|---|---|---|
| 4,881,236 A | 11/1989 | Brueck et al. |
| 5,226,053 A | 7/1993 | Cho et al. |
| 5,804,919 A | 9/1998 | Jacobsen et al. |
| 5,834,893 A | 11/1998 | Bulovic et al. |
| 6,160,828 A * | 12/2000 | Kozlov et al. ................ 372/39 |
| 6,194,119 B1 | 2/2001 | Wolk et al. |

FOREIGN PATENT DOCUMENTS

WO    WO 00/70691    11/2000

OTHER PUBLICATIONS

"Organic Light–Emitting Device with an Ordered Monolayer of Silica Microspheres as a Scattering Medium", by Takashi Yamasaki et al., Applied Physics Letter 76, No. 10 (2000) pp. 1243–1245.

"Light–Emitting Diodes with 31% External Quantum Efficiency by Outcoupling of Lateral Waveguide Modes", by R. Windisch et al., Applied Physics Letters, vol. 74, No. 16, Apr. 19, 1999, pp. 2258–2260.

"Enhanced Coupling to Vertical Radiation using a Two–Dimensional Photonic Crystal in a Semiconductor Light–Emitting Diode" by Alexei Erchak, et al., Applied Physics Letters, vol. 78, No. 5, Jan. 29, 2001, pp. 563–565.

"Resonant Cavity Light–Emitting Diode", by E. F. Schubert et al., Applied Physics Letters, 60 (8), Feb. 24, 1992, pp. 921–923.

"Light Amplification in Organic thin Films using Cascade Energy Transfer" by M. Berggren et al., Nature, vol. 389, Oct. 2, 1997, pp. 466–469.

* cited by examiner

Primary Examiner—Paul Ip
Assistant Examiner—James Menefee
(74) Attorney, Agent, or Firm—Raymond L. Owens

(57) ABSTRACT

A vertical cavity light-producing device which, in response to incident external light, produces quasi-laser light with an enlarged spectral linewidth selected to improve power conversion efficiency, including a substrate; a bottom dielectric stack reflective to light over a predetermined range of wavelengths; and an organic active region for producing quasi-laser light. The device also includes a top dielectric stack spaced from the bottom stack reflective to light over a predetermined range of wavelengths; the active region includes one or more periodic gain region(s) and organic spacer layers disposed on either side of the periodic gain region(s) arranged so that the periodic gain region(s) is aligned with the antinodes of the device's standing wave electromagnetic field; and the top or bottom dielectric stack being selected so that it's peak reflectance is less than 99% and the device's spectral linewidth is increased but produces an acceptable level of spontaneous emission.

6 Claims, 3 Drawing Sheets

VERTICAL CAVITY LIGHT-PRODUCING DEVICE WITH IMPROVED POWER CONVERSION

CROSS-REFERENCE TO RELATED APPLICATION

Reference is made to commonly assigned U.S. patent application Ser. No. 10/066,936 filed Feb. 4, 2002, entitled "Organic Vertical Cavity Laser Devices Containing Periodic Gain Regions" by Keith B. Kahen et al., the disclosure of which is incorporated herein by reference.

FIELD OF INVENTION

This invention relates to the field of light-emitting devices.

BACKGROUND OF THE INVENTION

Over the past decade, organic light emitting diodes (OLEDs) have shown increasing promise as inexpensive and efficient light sources. The devices are inexpensive to manufacture as a result of the device layers being composed of amorphous organic materials. Consequently, these layers can be inexpensively deposited by, for example, low vacuum thermal evaporation, spin casting, and ink-jet techniques. In contrast, inorganic light emitting diodes (LEDs) are composed of crystalline materials which require expensive deposition equipment, such as metal organic chemical vapor deposition and molecular beam epitaxy, and can only be deposited on specific substrates. The net result of this difference is that OLED-based multicolor arrays composed of hundreds of thousands (to millions) of pixels are being made routinely by many manufacturers worldwide largely for display applications.

With regard to the efficiency of OLED devices, their external quantum efficiencies are typically in the 1 to 3% range, in spite of their internal quantum efficiencies being as high as 80 to 90%. Part of this discrepancy is the result of spin statistics, whereby for non-phosphorescent materials three-quarters of the excitons are non-emitting triplets. However, a larger factor contributing to the difference in quantum efficiencies is the result of light-piping, where simple analysis (N. C. Greenham et al., Adv. Mater. 6, 491 [1994]) based on total internal reflection shows that only $\frac{1}{2}n^2$ (n is the index of refraction of the device layers) of the light generated in planar devices actually exits the device. For OLED devices n is on the order of 1.9; therefore, only 14% of the generated light escapes out of the top of the device.

Over the past decade a concerted effort has been expended by both inorganic and organic-based LED researchers to find some means for increasing the out-coupling efficiency of LED devices. Bulovic et al. in U.S. Pat. No. 5,834,893 have suggested growing the OLEDs in metallic pits with slanted side walls in order to out-couple the device's waveguide modes. A number of authors, such as Yamasaki et al., Appi. Phys. Lett. 76, 1243 (2000) and Windisch et al., Appl. Phys. Lett. 74, 2256 (1999) used scattering centers (volumetric or surface, respectively) to enhance the external efficiency. Others have depended on periodically positioned scatterers to enhance the out-coupling efficiency. For example, I. D. W. Samuel et al. in WO 00/70691 employed Bragg gratings to increase the out-coupling, while Erchak et al., Appl. Phys. Lett. 78, 563 (2001), used two-dimensional photonic crystal structures. In each case the extraction efficiency was enhanced; however, at the price of a loss of acutance. In other words, the enhanced out-coupling occurs over a distance larger than the original size of the pixel, which leads to an unwanted increase in the pixel dimensions.

A means for avoiding this acutance loss, while maintaining the enhanced out-coupling, is to employ a resonant cavity LED (RCLED) structure. Such a structure was originally proposed by Cho et al. in U.S. Pat. No. 5,226,053 for inorganic material systems. In their work they obtained approximately a factor of 1.7 increase in external efficiency relative to their LED control sample (E. F. Schubert et al., Appl. Phys. Lett. 60, 921 [1992]). Later, Jacobsen et al. in U.S. Pat. No. 5,804,919 made use of the RCLED concept to enhance the emission of phosphors for display applications. As pointed out by Cho et al. in U.S. Pat. No. 5,226,053, proper operation of the RCLED requires device structures very analogous to those of vertical cavity surface emitting lasers (VCSEL), except for one of the dielectric stack reflectivities being reduced from typical VCSEL values of >99%. In U.S. Pat. No. 5,804,919 to Jacobsen et al., there is no mention of the importance of lowering one of the dielectric stack reflectivities. In addition, Jacobsen et al. teach one to use bulk active region thicknesses, instead of thinner active regions (<30 nm) surrounded by spacer layers, which is required to get good efficiencies while keeping the unwanted spontaneous emission to a minimum. As a result, even though Jacobsen et al., in U.S. Pat. No. 5,804,919, mention employing organic active regions as the emitters, the structures they discussed are not properly constructed RCLED devices. Furthermore, the only organic emitter Jacobsen et al. mention is the host material Alq [aluminum tris(8-hydroxyquinoline)], which has very poor luminescent properties. As a result, to this date the RCLED concept has not been properly applied to organic emitter applications, where as discussed above it should enable enhanced out-coupling efficiencies, without the concomitant loss of acutance.

SUMMARY OF THE INVENTION

It is an object of this invention to provide a vertical cavity light-producing device that produces quasi-laser light with a spectral linewidth selected to improve power conversion efficiency.

These objects are achieved by a vertical cavity light-producing device which, in response to incident external light, produces quasi-laser light with an enlarged spectral linewidth selected to improve power conversion efficiency, comprising:

a) a substrate;

b) a bottom dielectric stack reflective to light over a predetermined range of wavelengths;

c) an organic active region for producing quasi-laser light;

d) a top dielectric stack spaced from the bottom dielectric stack and reflective to light over a predetermined range of wavelengths;

e) the organic active region includes one or more periodic gain region(s) and organic spacer layers disposed on either side of the periodic gain region(s) and arranged so that the periodic gain region(s) is aligned with the antinodes of the device's standing wave electromagnetic field; and f) the top or bottom dielectric stack being selected so that it's peak reflectance is less than 99% and the device's spectral linewidth is increased but produces an acceptable level of spontaneous emission, thereby resulting in improved power conversion efficiency.

ADVANTAGES

Quite unexpectedly, it has been determined that by proper selection of the reflectance of one of the dielectric stacks, the power conversion efficiency can be substantially increased, while the unwanted spontaneous emission is kept acceptably small. In addition, the radiated light maintains a narrow spectral linewidth and is emitted directionally about the optic axis of the device.

It is an advantage of the present invention to improve the device efficiency operation of a vertical cavity light-producing design by incorporating top and bottom dielectric stack reflectors, having gain regions consisting of organic material, with the gain region(s) placed at the antinodes of the standing wave electromagnetic field of the device. The reflectivities of one of the dielectric stacks is chosen to be high as typical for VCSEL devices, while the opposing dielectric stack's reflectance is lowered to less that 99%. As a result, the power conversion efficiency is improved, unwanted output due to spontaneous emission remains significantly reduced, while the radiated light maintains a narrow spectral linewidth and is emitted directionally about the optic axis of the device.

DETAILED DESCRIPTION OF THE INVENTION

The present invention uses an external light source (not shown) to drive a vertical cavity light-producing device in accordance with the present invention. Preferably the external light is produced by incoherent (and inexpensive) inorganic LEDs. Since the spot size of inorganic LEDs is generally wide (with typical inorganic LED pixel edge lengths on the order of 250 microns), the resultant laser emission from broad-area VCSEL-type devices is naturally multimode. For applications, such as display, multimode device operation is in fact preferred since it prevents the occurrence of unwanted speckle. As discussed above, in order to increase the output efficiency of vertical cavity light-producing organic devices, a route is to employ VCSEL structures, except the reflectance of one of the dielectric stacks is lowered in order to increase the device output efficiency. This type of design scheme is analogous to the RCLED structure of Cho et al. in U.S. Pat. No. 5,226,053, except our devices have much reduced spectral linewidths in comparison to the devices of Cho et al. Consequently, instead of referring to the devices as RCLED structures, they will be called quasi-laser devices, since the linewidths are below 6 nm and the unwanted spontaneous emission is largely clamped in comparison to the quasi-laser emission. To enable a high efficiency vertical cavity light-producing structure, it is necessary to construct a quasi-laser device 100 as shown schematically in FIG. 1 and in accordance with the present invention. The substrate 110 can either be light transmissive or opaque, depending on the intended directions of optical pumping and laser emission. The substrate 110 may be transparent glass or plastic. Alternatively, opaque substrates including, but not limited to, semiconductor materials (e.g., silicon) or ceramic materials may be used in the case where optical pumping and laser emission occur from the same surface.

Figure 1:
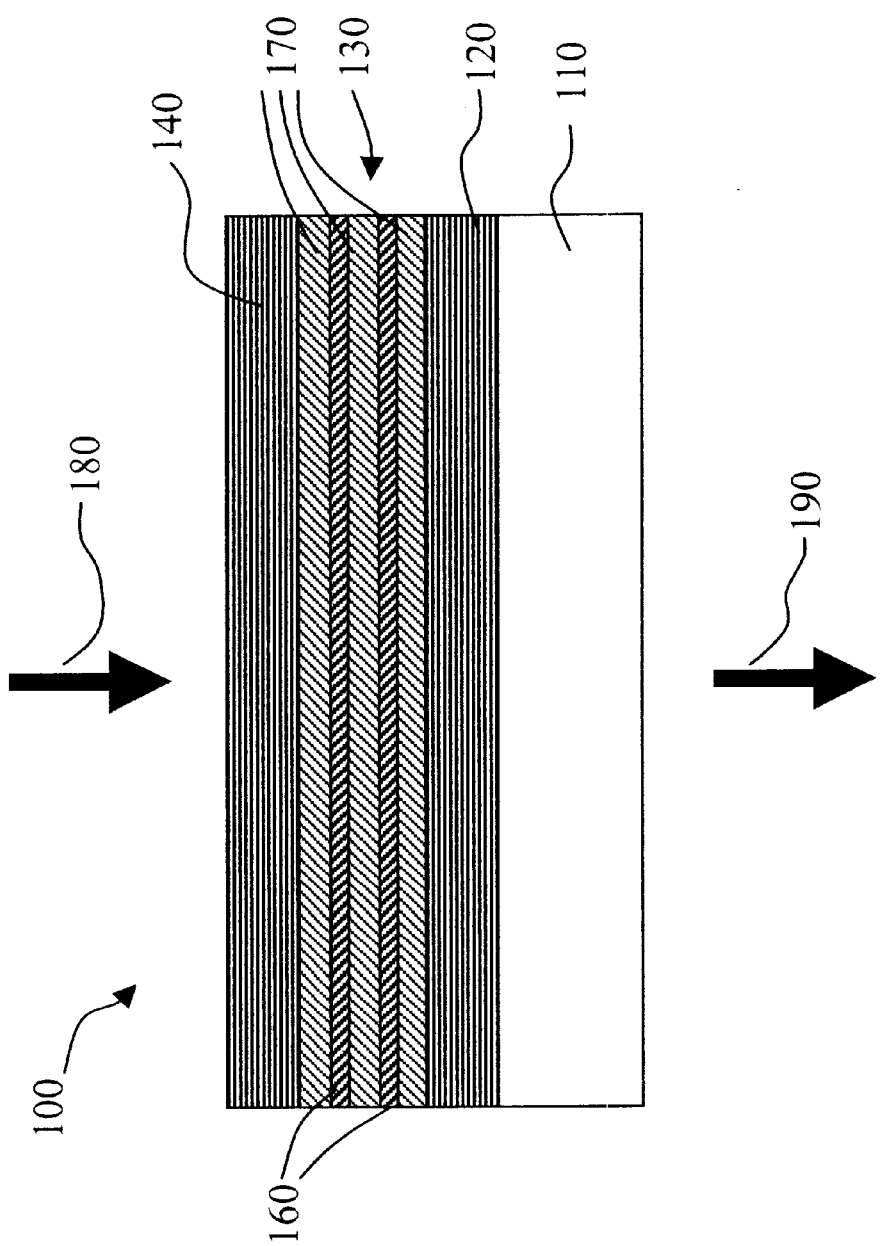
FIG. 1 shows a side view schematic of an optically pumped organic-based vertical cavity quasi-laser device according to the present invention.

On the substrate 110 is deposited a bottom dielectric stack 120, which is composed of alternating high and low refractive index dielectric materials. The bottom dielectric stack 120 is designed to be reflective to quasi-laser light over a predetermined range of wavelengths. Typical high and low refractive index materials are $TiO_2$ and $SiO_2$, respectively. The bottom dielectric stack 120 is deposited by standard electron-beam deposition, where a typical deposition temperature is 240° C. The organic active region 130 is deposited over the bottom dielectric stack 120. The active region can be composed of small-molecular weight organic material, conjugated polymeric organic material, or a combination of the two. The small-molecular weight organic material is typically deposited by high vacuum ($10^{-6}$ Torr) thermal evaporation, while the conjugated polymers are usually formed by spin casting. FIG. 1 shows that the organic active region 130 is not a bulk layer but a multilayer composite. Following the suggestions of Brueck et al. in U.S. Pat. No. 4,881,236 for inorganic VCSEL lasers, the organic active region 130 contains one or more periodic gain regions 160, which are separated by organic spacer layers 170. The thickness of the periodic gain regions 160 is typically less than 50 nm, with a preferred thickness of 10 to 30 nm. The thicknesses of the organic spacer layers 170 are chosen such that the periodic gain regions are aligned with the antinodes of the laser cavity's standing electromagnetic field. Employing periodic gain regions in the active region results in larger power conversion efficiencies and a large reduction in the unwanted spontaneous emission. In summary, the active region 130 includes one or more periodic gain regions 160 and organic spacer layers 170 disposed on either side of the periodic gain region(s) and arranged so that the periodic gain region(s) is aligned with the antinodes of the device's standing wave electromagnetic field.

The periodic gain region(s) 160 is composed of either small-molecular weight organic material or polymeric organic material, which fluoresce with a high quantum efficiency. Typical polymeric materials are, for example, polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein. In this embodiment, it is preferred to use a host-dopant combination as the gain media since it can result (via the mechanism of Forster energy transfer) in a very small unpumped band-to-band absorption coefficient, <1 $cm^{-1}$ for the gain media at the lasing wavelength (M. Berggren et al., Nature 389, 466 [1997]). An example of a useful host-dopant combination for green-emitting quasi-lasers is aluminum tris(8-hydroxyquinoline) (Alq) as the host and [10-(2-benzothiazolyl)-2,3,6,7-tetrahydro-1,1,7,7-tetramethyl-1H,5H,11H-[1]Benzopyrano[6,7,8-ij]quinolizin11-one] (C545T) as the dopant (at a volume fraction of 0.5%). Other host-dopant combinations can be used for emission in other wavelength regions, such as in the blue and red. For the organic spacer layer 170 it is preferred to use a material which is highly transparent to both the quasi-laser emission 190 and pump beam light 180 (produced by an external light source). In this embodiment 1,1-Bis-(4-bis(4-methyl-phenyl)-amino-phenyl)- cyclohexane (TAPC) is chosen as the spacer material, since it has very low absorption throughout the visible and near UV spectrum and its index of refraction is slightly lower than that of Alq. This refractive index difference is useful since it helps in maximizing the overlap between the standing electric-field antinodes and the periodic gain region(s) 160.

Following the active region 130 is deposited the top dielectric stack 140. The top dielectric stack 140 is spaced from the bottom dielectric stack and reflective to light over a predetermined range of wavelengths. Its composition is analogous to that of the bottom dielectric stack 120. Since the top dielectric stack 140 is deposited over an organic-based active region, its deposition temperature must be kept low in order to avoid melting the organics. As a result, a typical deposition temperature for the top dielectric stack 140 is 70° C. In order to obtain good quasi-lasing performance, it is preferred that the peak reflectivity of the top dielectric stack 140 be greater than 99%, preferably greater than 99.9% in order to prevent quasi-laser light emission through it. For the bottom dielectric stack 120, in order to enhance the quasi-laser light out-coupling efficiency, it is preferred that the stack reflectance be smaller than 99%, where further reductions in the bottom stack reflectance result in higher external efficiencies, larger spectral linewidths, and larger quasi-laser light emission cone angles. In summary, the bottom dielectric stack should be selected so that it's peak reflectance is less than 99%; as a result the spectral linewidth is increased but produces an acceptable level of spontaneous emission, thereby resulting in improved power conversion efficiency. In fact by lowering the bottom dielectric stack 120 peak reflectance to less than 85%, it was determined that the power conversion efficiency can be greater than 20%.

The quasi-laser device 100 is optically driven by incident pump beam 180 and emits quasi-laser emission 190. The pump beam can be either focused laser light or incoherent light, such as from an LED. FIG. 1 shows quasi-laser emission 190 through the bottom dielectric stack 120. Alternatively, in the case of an opaque (e.g., silicon) substrate, both optical pumping and quasi-laser emission occurs through the top dielectric stack 140, which in that case would have a peak reflectance less than 99%, while the bottom stack 120 peak reflectance would be greater than 99%. The operation of the optically pumped organic quasi-laser device occurs by the following means. The pump beam 180 transmits through the top dielectric stack 140, and is absorbed by the periodic gain region(s) 160, wherein some fraction of the pump beam energy is re-emitted as longer wavelength quasi-laser light. When the pump beam 180 enters through the top dielectric stack 140, to ensure that the quasi-laser output 190 mainly exits through the bottom dielectric stack 120 and the substrate 110, as discussed above, it is necessary to choose a large top dielectric stack 140 peak reflectance to avoid some emission through it. To improve the power conversion efficiency of the device, it is common practice to add additional dielectric layers to both dielectric stacks, such that the top dielectric stack 140 is highly transmissive to the pump beam 180 and the bottom dielectric stack 120 is highly reflective to the pump beam. As a result of the designed device structure, quasi-laser emission occurs mainly through the substrate 110. FIG. 1 shows the quasi-laser emission 190 through the bottom dielectric stack 120 and the substrate 110; alternatively, the quasi-laser structure could be optically pumped through the substrate 110 and the bottom dielectric stack 120, with the quasi-laser emission mainly exiting through the top dielectric stack 140 by proper design of the dielectric stack reflectivities. In the case of an opaque substrate, such as silicon, both optical pumping and quasi-laser emission occur through the top dielectric stack 140.

In an alternative embodiment of the present invention, the top dielectric stack 140 is replaced by the deposition of a reflective metal mirror layer. Typical metals are silver or aluminum, which have reflectivities in excess of 90%. It is preferred that the metals be deposited by vacuum thermal evaporation to avoid causing damage to the underlying organic layers. In this alternative embodiment, both the pump beam 180 and the quasi-laser emission 190 would proceed through the substrate 110.

The following examples are presented as further understandings of the present invention and are not to be construed as limitations thereon.

Example 1

In order to determine the output characteristics of the quasi-laser device of FIG. 1, quasi-laser structures were grown on pre-cleaned 6-inch quartz substrates. Over the substrate 110 was deposited by conventional electron-beam deposition the bottom dielectric stack 120, which was composed of alternating high and low refractive index layers of $Ta_2O_5$ and $SiO_2$, respectively. The resulting dielectric mirror had a measured peak reflectance of ~97.2% at 550 nm. On top of the bottom dielectric stack 120 was deposited, by high vacuum thermal evaporation, the organic active region 130, where in order was grown 152 nm of TAPC, 25 nm of Alq with 0.5% C545T, 140 mn of TAPC, 25 nm of Alq with 0.5% C545T, and 153 nm of TAPC. Lastly, the top dielectric stack 140 was deposited by low temperature electron-beam deposition, such that the measured temperature of the quartz substrate was kept below 72° C. It was composed of alternating high and low refractive index layers of $TiO_2$ and $SiO_2$, respectively. The resulting dielectric mirror had a measured peak reflectance of ~99.98% at 560 nm.

To test the devices for both their spectral and power characteristics, the quasi-laser cavities were optically pumped normal to the top side of the device using the 403 nm output from a 5 mW Nichia laser diode. The pump laser produced 50 nsec laser pulses at a repetition rate from 5 to 5000 KHz. The pump beam intensity was adjusted by the combination of two neutral density wheels and it was focused onto the laser cavity surface using a 1000 mm lens. The resulting measured pump beam spot on the device surface was elliptical with dimensions of 177×243 µm. For spectral measurements the quasi-laser output 190 from the cavity was focused on the entrance slit of a Spex double monochrometer (0.22 m) by the combination of a 25 mm f/1 lens and a 100 mm f/4 lens nearest the slit (resulting in a 4X magnification of the quasi-laser's near-field image). The resolution of the monochrometer is approximately 0.4 nm; its output was detected by a TE cooled Hamamatsu 928p photomultiplier tube.

Figure 2:
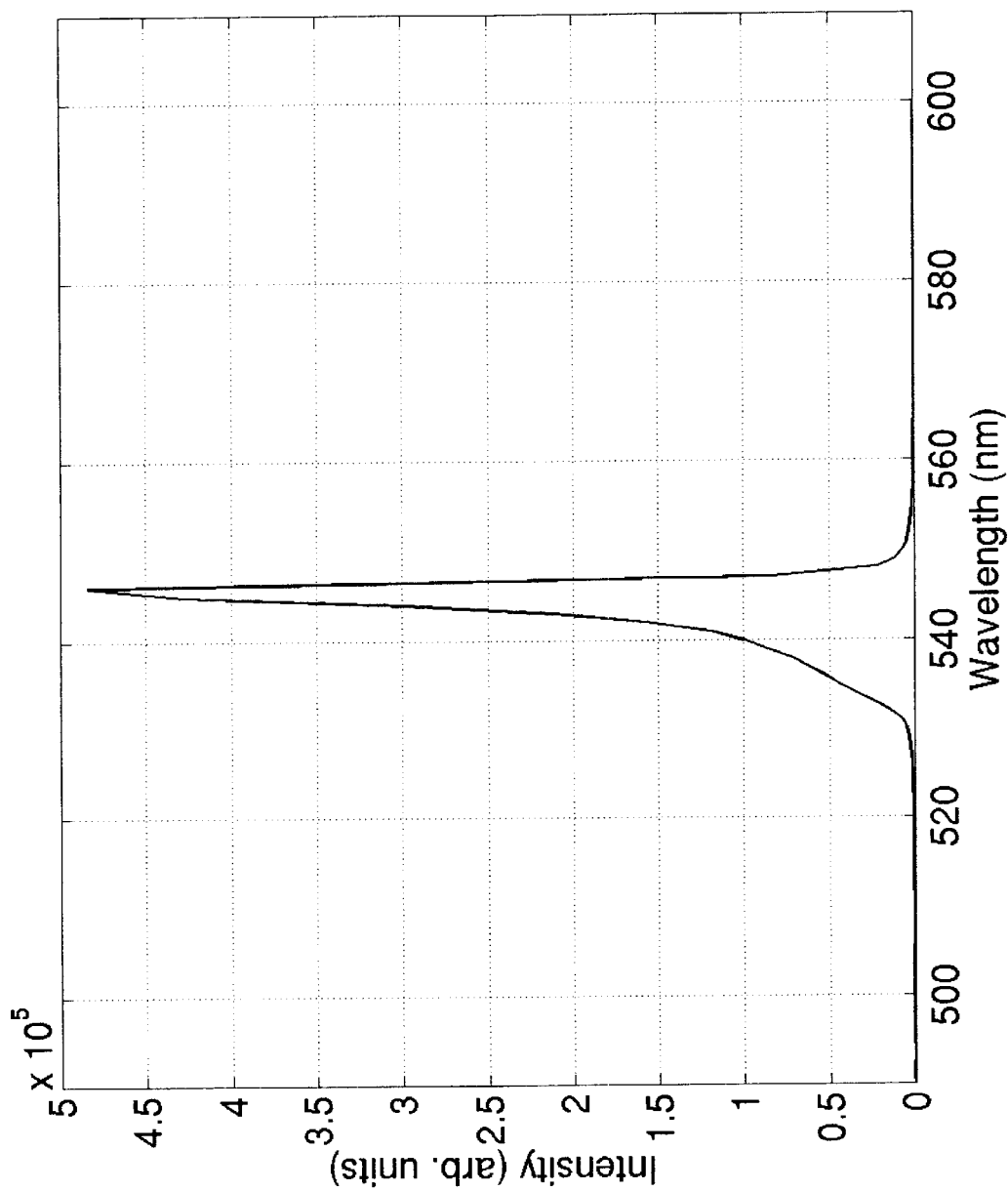
FIG. 2 shows a graph of intensity vs. wavelength and depicts the emission spectra from an optically pumped organic vertical cavity quasi-laser device.

FIG. 2 shows the quasi-laser spectrum collected by the 0.5 NA (numerical aperture) lens for a pump laser repetition rate of 500 KHz (2.5% duty cycle). The sample has one multi-mode quasi-laser peak at 546 nm, whose full-width at half-maximum (FWHM) is 3.3 nm. On the long wavelength side of the quasi-laser peak, the average spontaneous emission signal strength is 40 dB smaller than the quasi-laser peak at 546 nm. On the short wavelength side of the quasi-laser peak, the spontaneous emission signal is larger, with its average intensity being 34 dB smaller than the quasi-laser peak at 546 nm. Thus, in spite of lowering the reflectance of the bottom dielectric stack 120 from >99% (typical VCSEL value) to 97.2%, the spontaneous emission remains suppressed.

In order to determine the power conversion efficiency of this device, its output was collected by a calibrated integrating sphere. The pump source power density, duty cycle, and spot size at the device surface were analogous to that used to generate the spectra from FIG. 2. Accordingly, the measured absorbed (18% of the pump power was absorbed by the device) power conversion efficiency of the device was 15%. Taking into account that the pump beam 180 wavelength was 403 nm and the multimode quasi-laser peak from FIG. 2 was at 546 nm, the external quantum efficiency of the device is 20%.

Example 2

Figure 3:
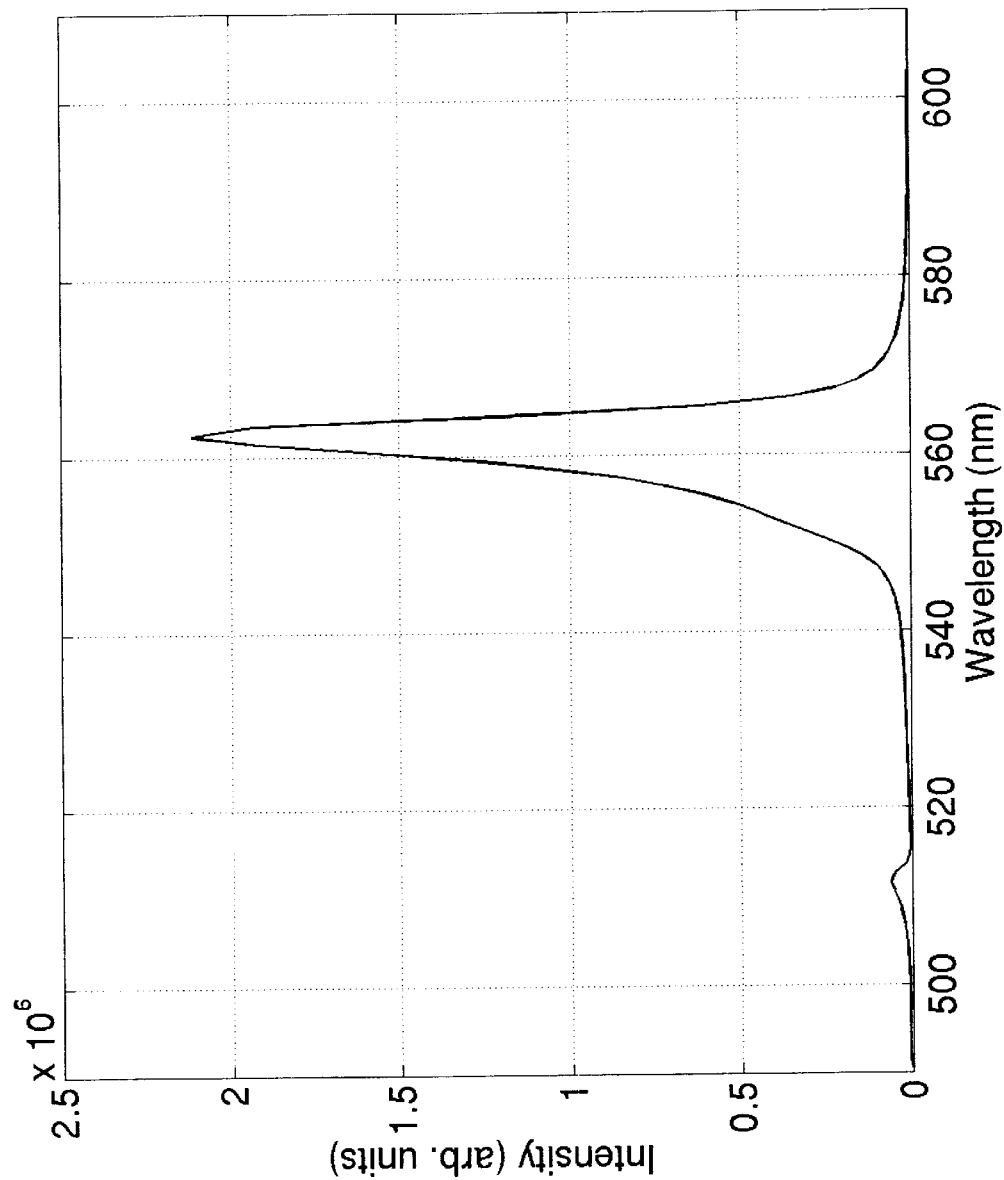
FIG. 3 is a graph, similar to FIG. 2, of the quasi-laser emission spectra from an optically pumped organic vertical cavity quasi-laser device except with a lowered dielectric stack reflectance.

The device structure is analogous to that of Example 1 except the design of the bottom dielectric stack 120 (it employed a mixture of $TiO_2$ and $Ta_2O_5$ for the high index material) was altered in order to obtain a measured peak reflectivity of 84% at 555 nm. Using the same excitation conditions as that employed to generate FIG. 2, except the pump beam repetition rate was increased to 5 MHz (25% duty cycle), FIG. 3 shows the device's output spectrum collected by the 0.5 NA lens. The sample has one quasi-laser peak at 562 nm, whose FWHM is 5.6 nm. At 511.4 nm there also appears a weak spontaneous emission peak (4.8 nm FWHM), whose intensity is 15 dB smaller than that of the quasi-laser peak at 562 nm. On the long wavelength side of the quasi-laser peak, the average spontaneous emission signal strength is 32 dB smaller than the quasi-laser peak. The appearance of the weak spontaneous emission peak is due to the lowering of the Q of the optical cavity, which results in non-resonance modes becoming more competitive with the resonance modes. With respect to the power conversion efficiency of this device, its measured value was 22%, which results in an external quantum efficiency of 31%. Besides measuring the power conversion efficiency at a few different pump beam duty cycles (0.25, 2.5, and 25%), it was also measured at two additional higher power densities. They were larger than the nominal power density by factors of 12.5 and 31, which resulted in pump beam power densities at the device surface of 2.1 and 5.2 $W/cm^2$, respectively. For all of these cases, the external quantum efficiency remained fixed at 31%. Thus, the system is linear in both duty cycle and in power density for the ranges studied. As discussed above, optically pumped planar OLED devices will at most have an external quantum efficiency of 14% (assuming the index of the layers is ~1.9 and taking the internal quantum efficiency at 100%). Therefore, the device of this example results in a factor of 2.2 increase in external quantum efficiency; concomitantly, there is a sharpening in spectral linewidth and no loss in device acutance.

The invention has been described in detail with particular reference to certain preferred embodiments thereof, but it will be understood that variations and modifications can be effected within the spirit and scope of the invention.

PARTS LIST

100 vertical cavity organic quasi-laser device
110 substrate
120 bottom dielectric stack
130 organic active region
140 top dielectric stack
160 periodic gain region
170 organic spacer layer
180 pump beam
190 quasi-laser emission

What is claimed is:

1. A vertical cavity light-producing device which, in response to incident external light, produces quasi-laser light with an enlarged spectral linewidth selected to improve power conversion efficiency, comprising:
   a) a substrate;
   b) a bottom dielectric stack reflective to light over a predetermined range of wavelengths;
   c) an organic active region for producing quasi-laser light;
   d) a top dielectric stack spaced from the bottom dielectric stack and reflective to light over a predetermined range of wavelengths;
   e) the organic active region includes one or more periodic gain region(s) each having a thickness less than 50 nm and greater than 0 nm and organic spacer layers disposed on either side of the periodic gain region(s) and arranged so that the periodic gain region(s) is aligned with the antinodes of the device's standing wave electromagnetic field; and
   f) the top or bottom dielectric stack being selected so that it's peak reflectance is less than 99% and the device's spectral linewidth is increased but produces an acceptable level of spontaneous emission, thereby resulting in improved power conversion efficiency.

2. The vertical cavity light-producing device of claim 1 wherein pump beam light is transmitted and introduced into the organic active region through at least one of the dielectric stacks.

3. The vertical cavity light-producing device of claim 2 wherein the organic active region includes a combination of a host material and a dopant and the organic spacer layer is substantially transparent to the pump beam and quasi-laser light.

4. The vertical cavity light-producing device of claim 3 wherein the host material is aluminum tris(8-hydroxyquinoline), the dopant is [10-(2-benzothiazolyl)-2,3,6,7-tetrahydro-1,1,7,7-tetramethyl-1H,5H,11H-[1] Benzopyrano[6,7,8-ij]quinolizin-11-one] and the organic spacer layers are 1,1-Bis-(4-bis(4-methyl-phenyl)-aminophenyl)-cyclohexane.

5. The vertical cavity laser light-producing device of claim 1 wherein the organic active region includes polymeric materials.

6. The vertical cavity laser light-producing device of claim 1 wherein the power conversion efficiency is greater than 20%.

* * * * *